(12) United States Patent
Foong (10) Patent No.: US 9,978,669 B2
(45) Date of Patent: May 22, 2018

(54) PACKAGED SEMICONDUCTOR DEVICE HAVING A LEAD FRAME AND INNER AND OUTER LEADS AND METHOD FOR FORMING

(71) Applicant: FREESCALE SEMICONDUCTOR, INC., Austin, TX (US)

(72) Inventor: Chee Seng Foong, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days. days.

(21) Appl. No.: 15/198,111

(22) Filed: Jun. 30, 2016

(65) Prior Publication Data

US 2018/0005925 A1    Jan. 4, 2018

(51) Int. Cl.
*H01L 23/495* (2006.01)
*H01L 23/31* (2006.01)
*H01L 21/48* (2006.01)
*H01L 21/56* (2006.01)

(52) U.S. Cl.
CPC .... *H01L 23/49555* (2013.01); *H01L 21/4825* (2013.01); *H01L 21/4842* (2013.01); *H01L 21/565* (2013.01); *H01L 23/3114* (2013.01); *H01L 23/4952* (2013.01); *H01L 23/49503* (2013.01)

(58) Field of Classification Search
CPC ......... H01L 23/49555; H01L 23/49503; H01L 23/4952; H01L 21/565; H01L 21/4825; H01L 21/4842; H01L 23/3114
See application file for complete search history.

(56) References Cited

U.S. PATENT DOCUMENTS

| | | | |
|---|---|---|---|
| 5,105,261 A | 4/1992 | Ueda et al. | |
| 5,227,995 A | 7/1993 | Klink et al. | |
| 5,891,377 A | 4/1999 | Libres et al. | |
| 5,994,768 A | 11/1999 | Fogelson | |
| 6,396,130 B1 * | 5/2002 | Crowley | H01L 23/49568 257/666 |
| 7,977,774 B2 | 7/2011 | Choi et al. | |
| 8,525,311 B2 | 9/2013 | Bai et al. | |
| 8,823,152 B1 | 9/2014 | Kim et al. | |
| 8,859,339 B2 | 10/2014 | Bai et al. | |
| 8,901,721 B1 | 12/2014 | Bai et al. | |
| 9,190,351 B2 | 11/2015 | Bai et al. | |
| 2004/0130008 A1 | 8/2004 | Johnson | |
| 2012/0286406 A1 | 11/2012 | Qiu et al. | |
| 2015/0206831 A1 | 7/2015 | Bai et al. | |

FOREIGN PATENT DOCUMENTS

JP    H0236542 A    2/1990

* cited by examiner

*Primary Examiner* — Hrayr A Sayadian (57) ABSTRACT

A method of making a packaged integrated circuit device includes forming a lead frame with leads that have an inner portion and an outer portion, the inner portion of the lead is between a periphery of a die pad and extends to one end of openings around the die pad. The outer portion of the leads are separated along their length almost up to an opposite end of the openings. Leads in a first subset of the leads alternate with leads in a second subset of the leads. The inner portion of the first subset of the leads is bent. The die pad, the inner portion of the leads, and only a first portion of the openings adjacent the inner portion of the leads are encapsulated. A second portion of the openings and the output portions of the leads form a dam bar for the encapsulating material.

10 Claims, 6 Drawing Sheets

PACKAGED SEMICONDUCTOR DEVICE HAVING A LEAD FRAME AND INNER AND OUTER LEADS AND METHOD FOR FORMING

BACKGROUND

Field

This disclosure relates generally to a packaged semiconductor device, and more specifically, to a packaged semiconductor device having a lead frame and inner and outer leads.

Related Art

A Quad Flat Package (QFP) is a surface mount integrated circuit package with leads extending from each of the four sides. However, the challenge with QFP designs is the limited number of I/Os available due to the nature of the peripherally located outer leads. In current QFP designs, about 50% of the metal sheets used to make the lead frame is stamped or etched out to form electrically isolated leads. This limits the number of leads which can ultimately be formed in a lead frame. As technology advances, though, a greater number of I/Os are needed to transmit signals to and from the packaged device. Therefore, a need exists for an improved QFP design which allows a greater number of leads to be formed in a lead frame.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In order to achieve a greater number of I/Os in a QFP, a lead frame is formed in which holes are punched out surrounding the periphery of the die pad at a location which corresponds to the edge of a subsequently formed encapsulant. Cuts are made to define each lead, in which the cuts extend from an inner end of the leads to the holes and from an outer end to a predetermined distance from the holes, leaving a region of still connected leads. The cuts also result in alternating leads extending different lengths outwardly from the holes toward the die site edge and from the holes towards the die pad. The inner portions of the leads are then bent in alternating directions. Afterwards, the encapsulant is formed in which the edge of the encapsulant overlaps a portion of each hole, and the region of still connected leads functions as a dam bar. After the encapsulation, the set of shorter leads extending from the encapsulant is bent near the encapsulant edge to form an inner set of leads. This bending results in fully shearing the leads along the cuts so they are no longer connected. The alternating set of longer leads can then be bent further out from the encapsulant edge to form an outer set of leads.

Figure 1:
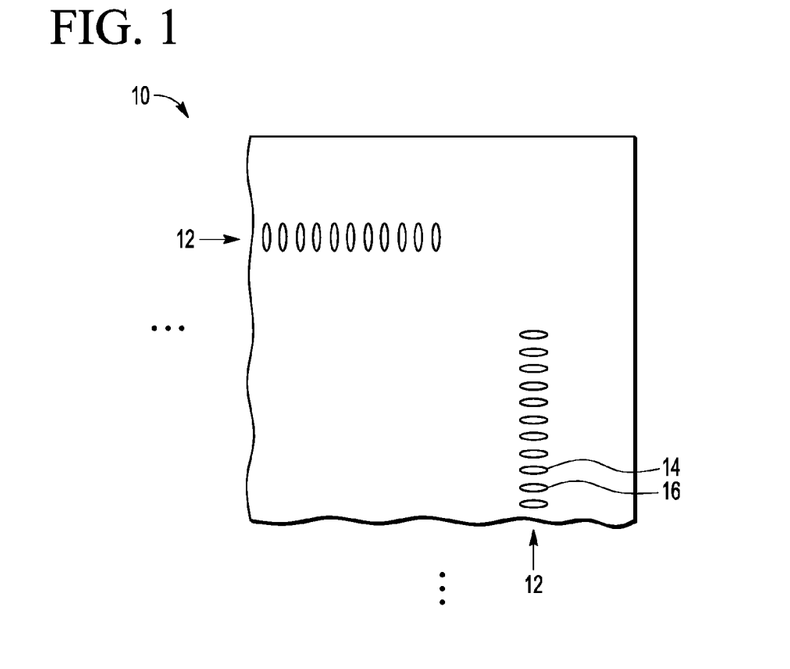
FIG. 1 illustrates a top down view of a portion of a lead frame at a stage in processing, in accordance with one embodiment of the present invention.

FIG. 1 illustrates a top down view of a portion of a lead frame 10 at a stage in processing, in accordance with one embodiment of the present invention. Lead frame 10 begins as a sheet of metal, such as copper, and may include an array or matrix of die sites in which each die site will result in a packaged device. In FIG. 1, the top right portion of one die site is illustrated. A plurality of holes 12 is punched in lead frame 10 around the periphery of the die site, surrounding what will be the die pad. Therefore, a set of holes is located at each side of the die site. Holes 14 and 16 are example holes of holes 12. In one embodiment, holes 10 are oblong in shape, with a major axis extending from an inner portion of the die site to an edge of the die site and substantially perpendicular to a lead frame edge. In each die site, holes 10 are formed at locations which correspond to the edges of a subsequently formed encapsulant, as will be seen below.

Figure 2:
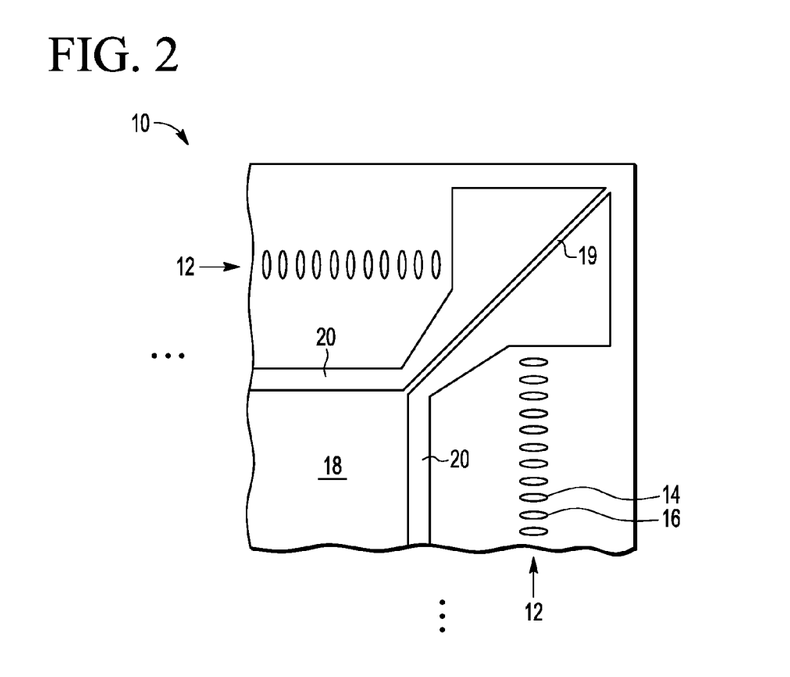
FIG. 2 illustrates a top down view of the lead frame of FIG. 1 at a subsequent stage in processing, in accordance with one embodiment of the present invention.

FIG. 2 illustrates a top down view of the portion of lead frame 10 at a subsequent stage in processing, in accordance with one embodiment of the present invention. Openings 20 are punched in lead frame 10 to form a die pad 18 for each die site, and tie bars 19 which allow die pad 18 to remain attached to lead frame 10. Note that die pad 18 may also be referred to as a flag. Tie bar 19 extends diagonally from a corner of die pad 18, between two sets of holes 10, to a corner of the corresponding die site. Each die site therefore includes a die pad, tie bars extending from each corner of the die pad, and a set of holes outside each side of the die pad.

Figure 3:
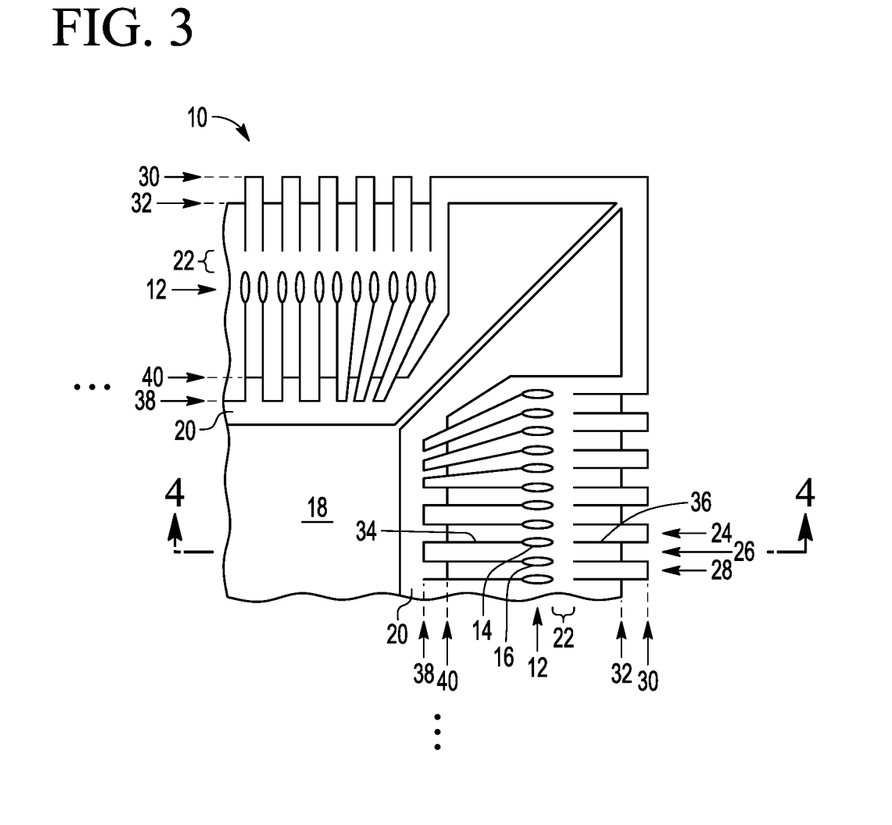
FIG. 3 illustrates a top down view of the lead frame of FIG. 2 at a subsequent stage in processing, in accordance with one embodiment of the present invention.

FIG. 3 illustrates a top down view of the portion of lead frame 10 at a subsequent stage in processing, in accordance with one embodiment of the present invention. Lead frame 10 is cut to form a plurality of leads, such as leads 24, 26, and 28, between each pair of adjacent holes of holes 10. An outer portion of the leads, located between holes 10 and an outer edge of the leads, extends to different distances away from holes 10. For example, the outer portion of the leads extends in an alternating manner to a distance 30 and a distance 32, where distance 30 extends further out from holes 10 than distance 32. Similarly, an inner portion of the leads, located between an inner edge of the leads and holes 10, extends to different distances from holes 10 towards die pad 18. For example, the inner portion of the leads extends in an alternating manner to a distance 40 and a distance 38, where distance 38 is further from holes 10 (and thus closer to die pad 18) than distance 40. In the illustrated embodiment, the leads that extend to distance 30 also extend to distance 40, such that the leads that extend to distance 32 also extend to distance 38. In this embodiment, the full length of each lead, whether extending from distance 30 to distance 40 or extending from distance 32 to distance 38, would be the same. In an alternate embodiment, the leads that extend to distance 30 also extend to distance 38, and the leads that extend to distance 32 also extend to distance 40 such that the full length of alternating leads are different. In this embodiment, the full length of leads extending between distance 30 and 38 would be longer than the full length of those leads extending between distance 32 and 40.

During the formation of the leads, a cut or slice is formed between each lead. An inner portion of the cuts extend from the inner ends of the leads all the way to holes 10. However, an output portion of the cuts extend from the outer ends of the leads to a predetermined distance from holes 10. For example, cut 34 extends from the inner ends of leads 24 and 26 to hole 14, and cut 36 extends from the outer ends of leads 24 and 26 to a predetermined distance from hole 10. This results in a region 22 of connected leads (not separated by cuts) that is immediately adjacent to the outer edge of holes 10. Also, each lead includes a reduced width portion, due to holes 10, located between the inner and outer portions of each lead. Therefore, the inner portion of each lead extends from the inner end of the lead to the reduced width portion, and the outer portion of each lead extends from the reduced width portion to the outer end.

Note that the cuts and punch outs described in reference to FIGS. 1-3 of lead frame 10 can be performed in a different order than described, with the resulting lead frame after FIGS. 1-3 being as shown in FIG. 3. After the cuts are completed, the inner portions of the leads are bent upwards and downwards in an alternating manner. For example, in one embodiment, the inner portions of the set of leads which extend to distance 40 are bent upwards and the inner portion of the set of leads which extend to distance 38 are bent downwards.

Figure 4:
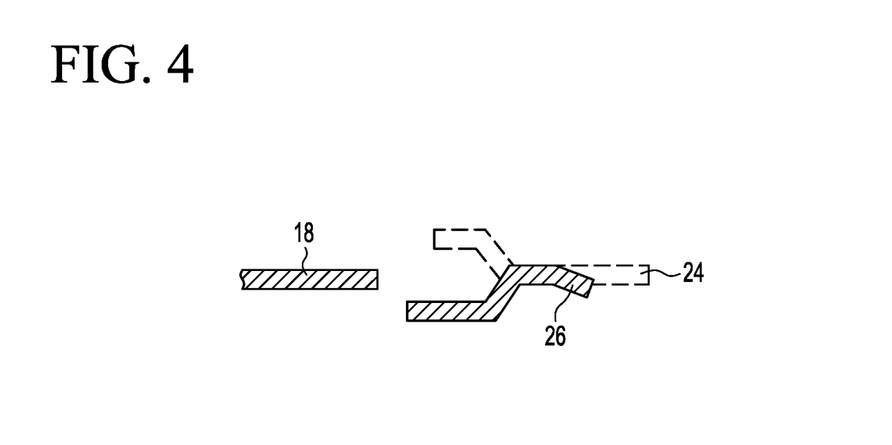
FIG. 4 illustrates a cross-sectional view of the lead frame of FIG. 3.

FIG. 4 illustrates a cross-sectional view of the lead frame 10 of FIG. 3 taken between leads 24 and 26. The inner portion of lead 26 (which extends to distance 40) is bent downwards and the inner portion of lead 24 (which extends to distance 38 and is shown in dotted lines) is bent upwards. Note that the set of inner portions that are bent downwards are bent so as to be coplanar at a first level, and the set of inner portions that are bent upwards are bent so as to be coplanar at a second level, different from the first level. In the illustrated embodiment, the first level is below the level of die pad 18, and the second level is above the level of die pad 18. In alternate embodiments, die pad 18 may be downset such that both the first level and second level are above die pad 18. Also, as a result of bending the inner portions of the leads, the outer portion of the set of leads extending to distance 32 may also result in a slight downward bend. With the bending of the inner portions of the leads, in combination with the reduced width portion of the leads due to holes 10, the inner portions of the leads are physically separate from each other.

In the illustrated embodiment, the inner portion of each lead is bent in an opposite direction as the inner portion of the adjacent lead. For example, the inner portions of leads 24 and 28 are bent in one direction (upwards) and the inner portion of lead 26 is bent in an opposite direction (downwards). In alternate embodiments, the inner portion of alternating leads are bent in one direction while the inner portion of the remaining leads are not bent. If the inner portion of a set of leads is not bent, then the inner portions are coplanar at a level that is coplanar with die pad 18. Also, the degree of bending for those leads bent upwards may be different than for those bent downwards.

After the inner portions are bent upwards or downwards, a die is attached to die pad 18 and wire bonds are formed from a top surface of the die to the inner portions of the leads. Since the inner portions of the leads are at different levels with respect to die pad 18, a support structure having supports of different heights is used under lead frame 10 to support the leads of lead frame 10 during wire bonding. The die can be attached to die pad 18 and the wire bonding can be performed as known in the art.

Figure 5:
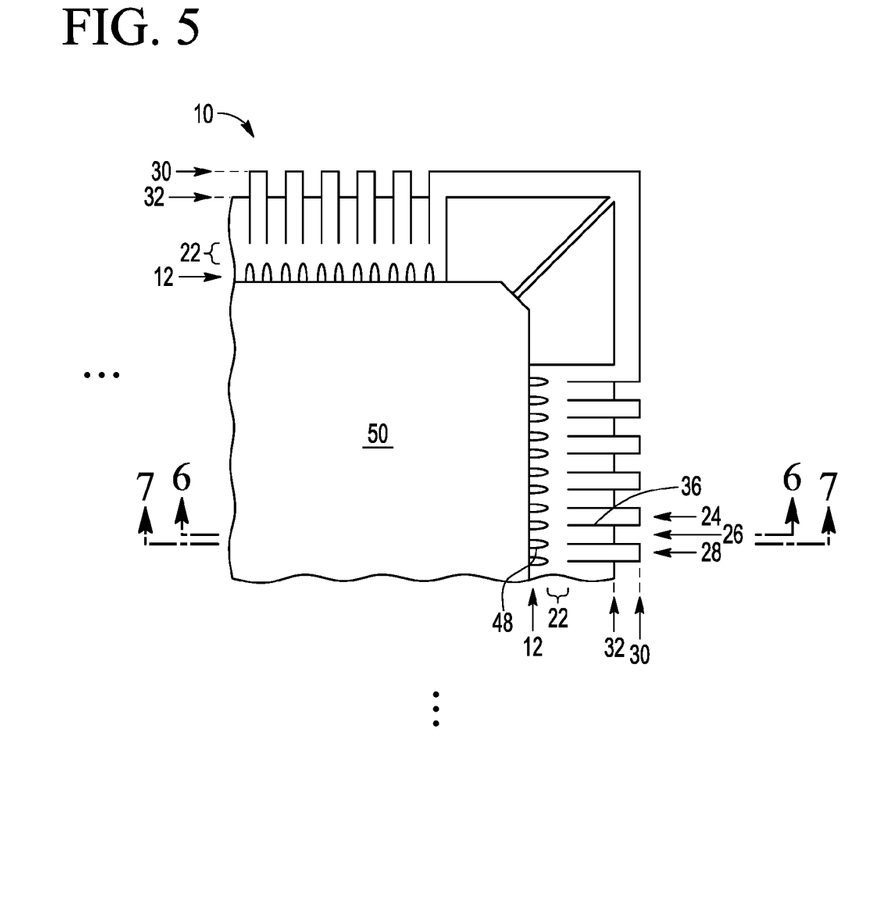
FIG. 5 illustrates a top down view of a portion of a packaged device formed with the lead frame of FIG. 3 at a subsequent stage in processing, in accordance with one embodiment of the present invention.

FIG. 5 illustrates a top down view of a portion of lead frame 10 at a subsequent stage in processing, in accordance with one embodiment of the present invention. After the wire bonds are formed, the die site is encapsulated by an encapsulant 50, and may therefore be referred to as a packaged device. Encapsulant 50 is formed such that it covers a portion (e.g., about half) of each of holes 10. That is, the edge of encapsulant 50 extends over a portion of each of holes 10. The connected portions of leads in region 22 and the remaining portion of holes 10 operate as a dam bar to prevent encapsulant 50 from leaking further out. The remaining portions of each of holes 10 extending from the edge of encapsulant 50 is filled with encapsulant 50 during the encapsulation process, resulting in encapsulant protrusions which extend from encapsulant 50, between adjacent leads, such as protrusion 48 located between leads 26 and 28.

Figure 6:
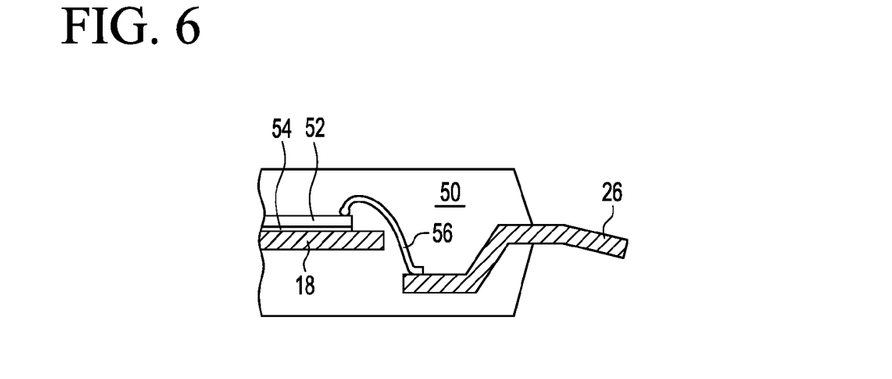
FIG. 6 illustrates a cross-sectional view of the packaged device of FIG. 5 taken at a first cross section location.

FIG. 6 illustrates a cross-sectional view of the packaged device of FIG. 5 taken at a first cross section location through lead 26. A die 50 is attached via die attach material 54 to die pad 18. Wire bond 56 is formed from a top surface of die 50 to the inner portion of lead 26, which is located at the first level, below die pad 18.

Figure 7:
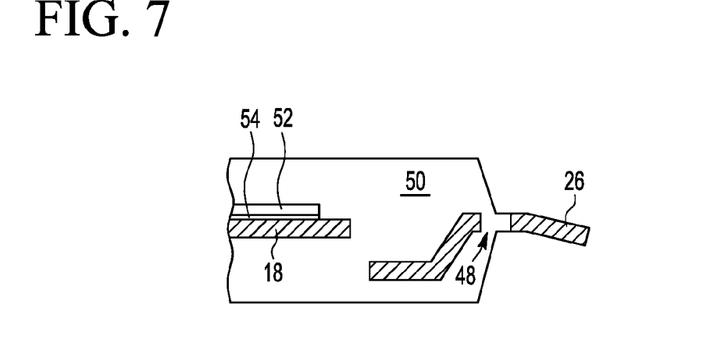
FIG. 7 illustrates a cross-sectional view of the packaged device of FIG. 5 taken at a second cross section location.

FIG. 7 illustrates a cross-sectional view of the packaged device of FIG. 5 taken at a second cross section location, between leads 28 and 26. Since the cross section is taken between two leads, a wire bond connection is not visible from die 50. However, in FIG. 7, protrusion 48 is visible in lead 26.

Figure 8:
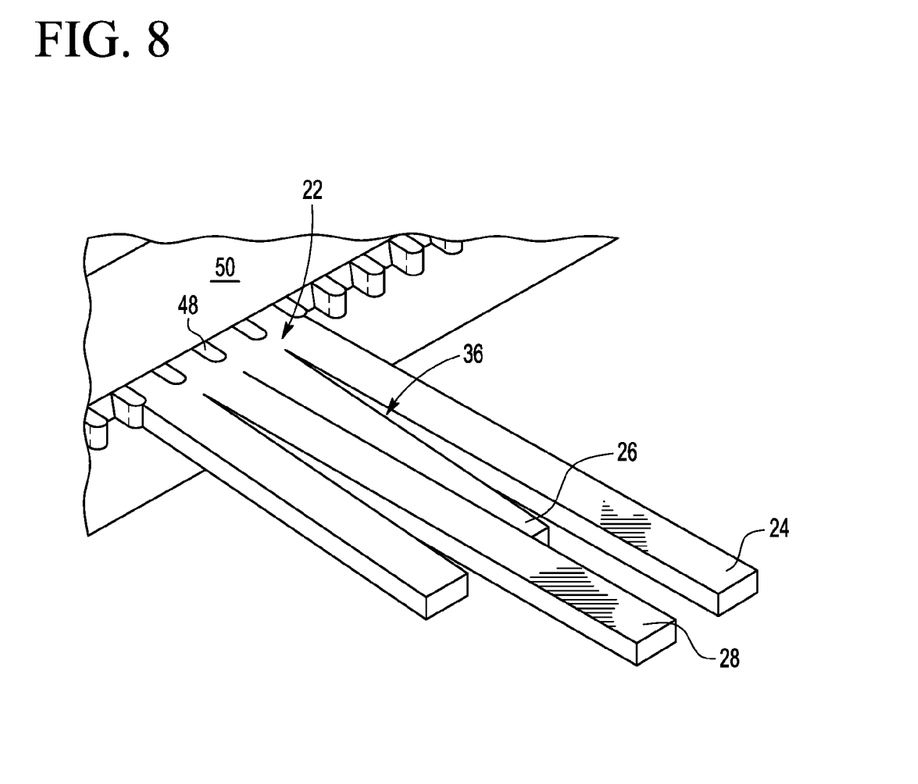
FIG. 8 illustrates an isometric view of the packaged device of FIG. 5.

FIG. 8 illustrates an isometric view of the packaged device of FIG. 5. In FIG. 8, protrusion 48 extends from encapsulant 50 between leads 26 and 28. Also, it can be seen that the outer cuts, located between adjacent leads, extends from the outer ends of the leads up to almost reaching holes 10, and thus protrusion 48. Therefore, the leads in region 22 remain connected to serve as a dam bar during the encapsulation.

Figure 9:
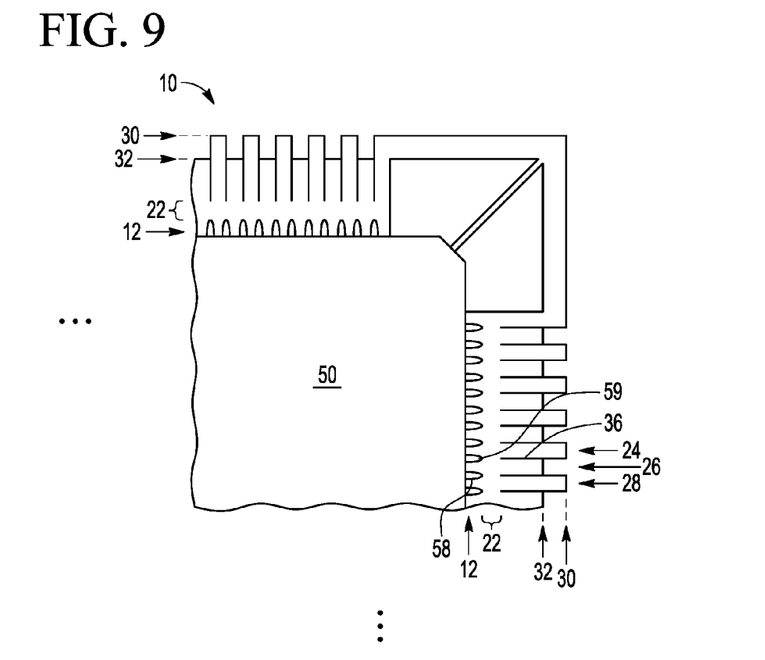
FIG. 9 illustrates a top down view of the packaged device of FIG. 5 at a subsequent stage in processing, in accordance with one embodiment of the present invention.

FIG. 9 illustrates a top down view of the packaged device of FIG. 5 at a subsequent stage in processing, in accordance with one embodiment of the present invention. The encapsulant protrusions formed in the outer portion of each of holes 10 are punched out, leaving the portion of hole 10 uncovered by encapsulant 50, open. For example, protrusion 48 is punched out, leaving opening 58 which extends from the outer edge of encapsulant 50. Opening 59 is also formed in the same manner. Note that these resulting openings allow each lead to have a narrower portion at the edge of encapsulant 50. For example, lead 26 includes a narrower portion between openings 58 and 59 as compared to the outer portion of lead 26. At this point in processing, the leads in region 22 are still connected.

Figure 10:
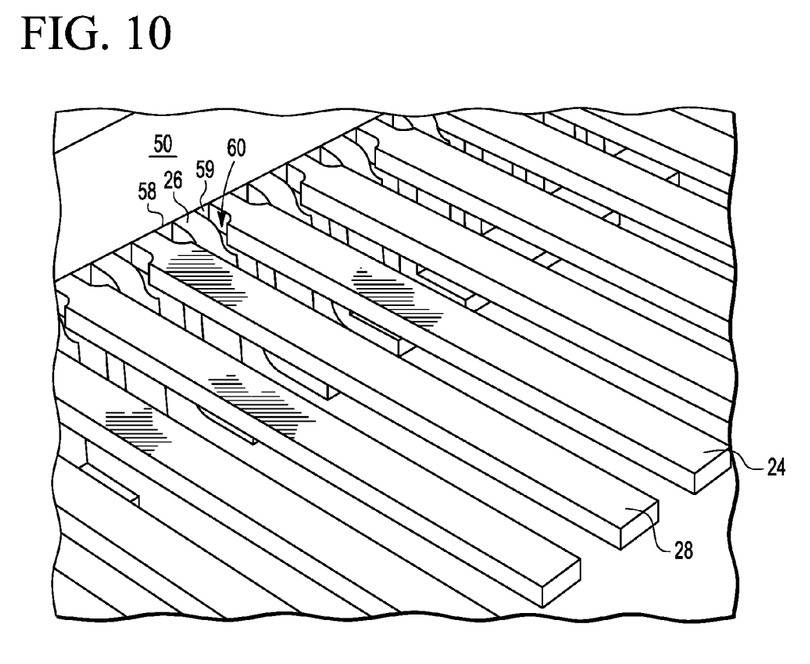
FIGS. 10-11 illustrates isometric views of the packaged device of FIG. 8 at various processing stages, in accordance with embodiments of the present invention.

FIG. 10 illustrates an isometric view of the packaged device of FIG. 9 at a subsequent stage in processing. The outer portion of the set of shorter leads, which extended to distance 32 rather than distance 30, is bent 90 degrees downwards, close to encapsulant 50, to form a set of inner leads. This bending of the shorter leads results in shearing the connection between the shorter lead and its adjacent leads, extending the previous made cuts. For example, when lead 26 is bent downwards, the connection portion at location 60 with adjacent lead 24 is sheared. This shearing along with opening 59 allows lead 26 to be physically separate from lead 24. Likewise, this shearing occurs between every adjacent pair of leads extending the previously made cuts, which, along with the openings, physically separate all the leads. Therefore, lead 26 is also physically separated from lead 28 due opening 58 and the shearing between leads 26 and 28. As described above, the formation of holes 10 allow for a narrower portion of each lead at the edge of encapsulant 50 such that after the shorter leads are bent and the connected portions are sheared, adjacent leads are fully isolated from each other.

Figure 11:
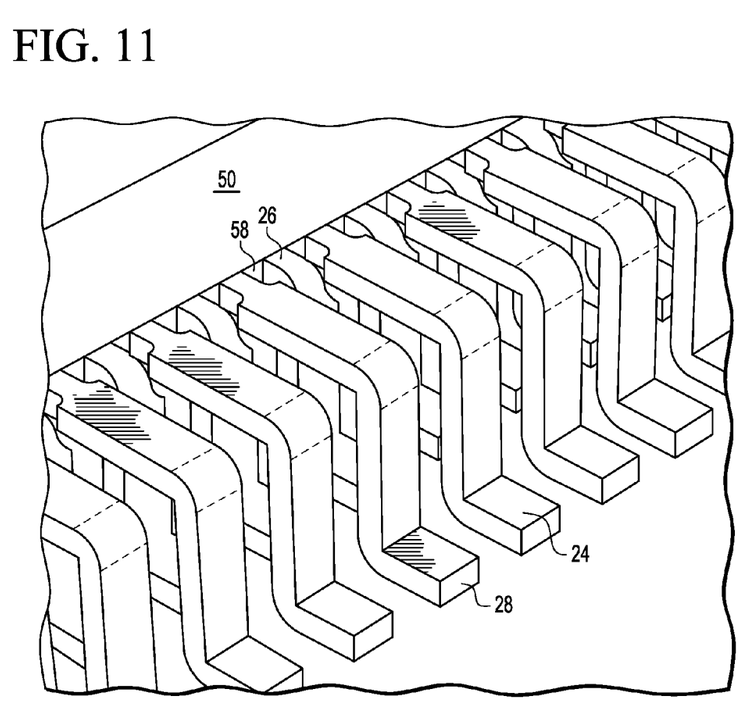

FIG. 11 illustrates an isometric view of the packaged device of FIG. 10 at a subsequent stage in processing. The outer portion of the remaining set of longer leads, which extended to distance 30 rather than distance 32, is bent 90 degrees downwards at a distance further away from encapsulant 50 to form a set of outer leads. That is, the inner leads are bent downwards at a distance from encapsulant 50 that is less than the distance from encapsulant 50 at which the outer leads are bent. The outer ends of the inner and outer leads can have a variety of different shapes. In the illustrated embodiment, they have a gull wing shape. Alternatively, they may have a J shape. After the formation of the inner and outer leads, the die sites are singulated to form a plurality of physically separate packaged devices, each including a corresponding encapsulated die and set of inner and outer leads.

Note that the cuts between leads, such as cuts 34 and 36, are formed by slicing through the metal without punching out a section between the leads. Typically, an entire section is punched out between leads to physically isolate the leads. However, in the current application, no entire section between leads is punched out, allowing the leads to remain tightly packed. Instead, holes 10 are formed at a location which corresponds to the edge of the encapsulant. These holes result in a narrower portion (i.e. a reduced width portion) of each lead extending from encapsulant 50 which, in combination with bending the inner portions of the leads in different directions and bending the outer portions of leads at different distances from encapsulant 50, allow the leads to be isolated from each other while remaining tightly packed. This results in a higher number of available I/Os for each packaged device.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, holes 12 may be of a different shape, such as, for example, rectangular. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

An embodiment relates to a method of making a packaged integrated circuit device includes forming a plurality of openings in a sheet of material; forming a die pad of a lead frame in the sheet of material; forming leads in the sheet of material, wherein the leads have an inner portion and an outer portion, the inner portion of the lead is between a periphery of the die pad and extends to one end of the openings, the outer portion of the leads are separated along their length almost up to an opposite end of the openings, leads in a first subset of the leads alternate with leads in a second subset of the leads around the periphery of the die pad; bending the inner portion of the first subset of the leads; encapsulating, with encapsulating material, the die pad, the inner portion of the leads, and only a first portion of the openings adjacent the inner portion of the leads, wherein a second portion of the openings and the output portions of the leads form a dam bar for the encapsulating material. In one aspect of the above embodiment, the periphery of the die pad is surrounded by the inner portion of the leads. In another aspect, the method further includes removing the encapsulating material in the second portion of the openings. In another aspect, the method further includes separating the outer portions of the first subset of the leads from the outer portions of the second subset of the leads up to the openings. In a further aspect, the method further includes bending the outer portion of the first subset of the leads at the second portion of the openings; bending the outer portion of the second subset of the leads, wherein a bend in the outer portion of the second subset of the leads is further from a respective one of the openings than a bend in the first subset of the leads. In another further aspect, the method further includes bending the outer portion of the second subset of the leads at the second portion of the opening; bending the outer portion of the first subset of the leads, wherein a bend in the outer portion of the first subset of the leads is further from the opening than a bend in the second subset of the leads. In another aspect, the method further includes forming tie bars to the die pad in the sheet of material. In another aspect, the method further includes bending the inner portion of the second subset of the leads opposite a bend in the inner portion of the first subset of the leads. In another aspect, bending the inner portion of the second subset of the leads in a location closer to the encapsulating material than the bend in the first subset of the leads. In another aspect, the method further includes shortening a length of the outer portion of the first or second subset of the leads.

In another embodiment, a packaged integrated circuit (IC) device includes a lead frame with a die pad; leads around a periphery of the die pad, wherein the leads have an inner portion and an outer portion, the inner portion of each of the leads is between a periphery of the die pad and extends to one end of a section having reduced width, the outer portion of each of the leads extends from an opposite end of the section having reduced width, each lead in a first subset of the leads is between two leads in a second subset of the leads, the inner portion of the first subset of the leads is bent at the one end of the section having reduced width to prevent contact with the inner portion of the second subset of the leads, the outer portion of one of the first or second subsets of the leads is bent at the opposite end of the section having reduced width to prevent contact with the outer portion of the other one of the first or second subsets of leads, and the outer portion of the other one of the first or second subsets of the leads is bent at a distance from the opposite end of the section having reduced width. In one aspect of the another embodiment, the packaged IC device further includes encapsulating material over the die pad, the inner portion of the leads, and only a first portion of the section having reduced width adjacent the inner portion of the leads. In a further aspect, the packaged IC device further includes space adjacent the section having reduced width outside the encapsulating material is not filled with the encapsulating material. In another aspect, the outer portion of the first or second subset of the leads has a different length than a length of the outer portion of the other of the first or second subset of the leads. In another aspect, the packaged IC device further includes an IC die mounted on the die pad. In a further aspect, the packaged IC device further includes wire bonds between bond pads on the IC die and the leads.

In yet another embodiment, a method of making a packaged integrated circuit (IC) device includes stamping a matrix of lead frames from a sheet of material, wherein each of the lead frames includes a die pad; forming leads around each of the die pads, wherein the leads have a section of reduced width between an inner portion and an outer portion of the leads, each lead in a first subset of the leads is between two leads in a second subset of the leads, bending the inner portion of the first subset of the leads at the one end of the section having reduced width to prevent contact with the inner portion of the second subset of the leads, bending the outer portion of one of the first or second subsets of the leads at the opposite end of the section having reduced width to prevent contact with the outer portion of the other one of the first or second subsets of leads, wherein the outer portion of the other one of the first or second subsets of the leads is bent at a distance from the opposite end of the section having reduced width. In one aspect of the above yet another embodiment, the method further includes encapsulating the die pad, the inner portion of the leads, and only a first portion of the section having reduced width adjacent the inner portion of the leads, wherein a second portion of the section having reduced width and adjacent portions of the outer portions of the leads form a dam bar for encapsulating material. In yet a further aspect, the method further includes removing the encapsulating material from the second portion of the section having reduced width. In another aspect, the method further includes reducing a length of the outer portion of the first or second subset of the leads compared to a length of the other of the first or second subset of the leads.

What is claimed is:

1. A method of making a packaged integrated circuit device comprising:
    forming a plurality of openings in a sheet of material;
    forming a die pad of a lead frame in the sheet of material;
    forming leads in the sheet of material, wherein
        the leads have an inner portion and an outer portion, the inner portion of the lead is between a periphery of the die pad and extends to one end of the openings,
        the outer portion of the leads are separated along their length almost up to an opposite end of the openings,
        leads in a first subset of the leads alternate with leads in a second subset of the leads around the periphery of the die pad;
    bending the inner portion of the first subset of the leads;
    encapsulating, with encapsulating material, the die pad, the inner portion of the leads, and only a first portion of the openings adjacent the inner portion of the leads, wherein a second portion of the openings and the output portions of the leads form a dam bar for the encapsulating material.

2. The method of claim 1 wherein the periphery of the die pad is surrounded by the inner portion of the leads.

3. The method of claim 1 further comprising:
    removing the encapsulating material in the second portion of the openings.

4. The method of claim 1 further comprising:
    separating the outer portions of the first subset of the leads from the outer portions of the second subset of the leads up to the openings.

5. The method of claim 4 further comprising:
    bending the outer portion of the first subset of the leads at the second portion of the openings;
    bending the outer portion of the second subset of the leads, wherein a bend in the outer portion of the second subset of the leads is further from a respective one of the openings than a bend in the first subset of the leads.

6. The method of claim 4 further comprising:
    bending the outer portion of the second subset of the leads at the second portion of the opening;
    bending the outer portion of the first subset of the leads, wherein a bend in the outer portion of the first subset of the leads is further from the opening than a bend in the second subset of the leads.

7. The method of claim 1 further comprising:
    forming tie bars to the die pad in the sheet of material.

8. The method of claim 1 further comprising:
    bending the inner portion of the second subset of the leads opposite a bend in the inner portion of the first subset of the leads.

9. The method of claim 1 wherein:
    bending the inner portion of the second subset of the leads in a location closer to the encapsulating material than the bend in the first subset of the leads.

10. The method of claim 1 further comprising:
    shortening a length of the outer portion of the first or second subset of the leads.

* * * * *